(12) United States Patent
Shimada et al.

(10) Patent No.: US 10,982,977 B2
(45) Date of Patent: Apr. 20, 2021

(54) PULSE SIGNAL GENERATOR AND ANGLE DETECTION SYSTEM INCLUDING THE SAME

(71) Applicant: RENESAS ELECTRONICS CORPORATION, Tokyo (JP)

(72) Inventors: Hiroshi Shimada, Tokyo (JP); Yuji Shimizu, Tokyo (JP); Yutaka Ono, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 166 days.

(21) Appl. No.: 16/406,902

(22) Filed: May 8, 2019

(65) Prior Publication Data

US 2019/0368899 A1 Dec. 5, 2019

(30) Foreign Application Priority Data

May 30, 2018 (JP) .............................. JP2018-103309

(51) Int. Cl.
*G01D 5/244* (2006.01)
*H03K 21/10* (2006.01)

(52) U.S. Cl.
CPC ............. *G01D 5/244* (2013.01); *H03K 21/10* (2013.01)

(58) Field of Classification Search
CPC .. G01D 5/244; G01D 5/24476; G01D 5/2448; G01D 5/2451; G01D 5/247; G01P 3/481; G01P 3/489; H02P 6/17; H03K 21/10
See application file for complete search history.

(56) References Cited

U.S. PATENT DOCUMENTS

| 4,973,959 | A | * | 11/1990 | Kobari | ................... | G01D 5/244 |
| | | | | | | 341/13 |
| 5,442,273 | A | * | 8/1995 | Ikawa | ..................... | H02P 23/16 |
| | | | | | | 318/400.41 |
| 8,872,511 | B2 | * | 10/2014 | Manabe | ............. | G01D 5/24419 |
| | | | | | | 324/207.25 |
| 9,641,367 | B2 | | 5/2017 | Shimizu et al. | | |

(Continued)

FOREIGN PATENT DOCUMENTS

JP 2017-032480 A 2/2017

*Primary Examiner* — Steven L Yeninas
(74) *Attorney, Agent, or Firm* — McDermott Will & Emery LLP

(57) ABSTRACT

A pulse signal generator suitable for generating a two-phase pulse signal required as information of a rotation angle of a motor from a motor control device is provided. According to an embodiment, the pulse signal generator includes: a compensation unit that outputs a compensation signal for compensating for the deviation between the angle information representing the rotation angle of the rotor provided in the resolver and the fed back angle information; a counter pulse output unit that outputs a counter pulse having a frequency corresponding to the compensation amount of the compensation signal and code information representing the sign of the compensation signal, and a pulse processing unit that outputs a count value by a counter as the angle information, which counts the pulse according to the code information, the pulse processing unit generating two-phase pulse signals PA and PB using the values of the counter.

15 Claims, 13 Drawing Sheets

(56) References Cited

U.S. PATENT DOCUMENTS

| | | | | |
|---|---|---|---|---|
| 2004/0260499 | A1* | 12/2004 | Ito | G01D 5/2448 |
| | | | | 702/104 |
| 2010/0001778 | A1* | 1/2010 | Nishimura | H03M 1/485 |
| | | | | 327/295 |
| 2010/0007294 | A1* | 1/2010 | Hasegawa | G11B 19/28 |
| | | | | 318/400.04 |
| 2013/0334993 | A1* | 12/2013 | Jang | H02P 6/17 |
| | | | | 318/400.04 |
| 2014/0354271 | A1* | 12/2014 | Kawase | G01D 5/2451 |
| | | | | 324/207.25 |
| 2016/0202088 | A1* | 7/2016 | Kishimoto | G01D 5/204 |
| | | | | 324/207.25 |
| 2019/0123666 | A1* | 4/2019 | Mizuo | H02P 6/153 |
| 2019/0226880 | A1* | 7/2019 | Raman | G01D 5/24476 |
| 2020/0370926 | A1* | 11/2020 | Nishijima | G01D 5/2448 |

* cited by examiner

PULSE SIGNAL GENERATOR AND ANGLE DETECTION SYSTEM INCLUDING THE SAME

CROSS-REFERENCE TO RELATED APPLICATIONS

The disclosure of Japanese Patent Application No. 2018-103309 filed on May 30, 2018 including the specification, drawings and abstract is incorporated herein by reference in its entirety.

BACKGROUND

The present invention relates to a pulse signal generator and an angle detection system comprising the same, and, for example, to a pulse signal generator suitable for generating a two-phase pulse signal required as information of a rotation angle of a motor from a motor control device, and to an angle detection system comprising the same.

The angle detection device includes a device for detecting the rotation angle of the motor using a rotary encoder, and in recent years, a device for detecting the rotation angle of the motor using a resolver. For example, Japanese Patent Laid-Open No. 2017-32480 discloses an apparatus for detecting the rotation angle of a motor using a resolver.

SUMMARY

Here, an angle detection device that detects the rotation angle of a motor using a rotary encoder generally generates two-phase pulse signals (so-called A-phase and B-phase pulse signals) as information on the rotation angle of the motor. Therefore, many of the motor control devices are configured to control the motor based on the two-phase pulse signal received from the angle detection device.

However, the angle detection device disclosed in Patent Document 1 outputs angle data calculated by the calculation processing unit, instead of outputting a two-phase pulse signal, as information on the rotation angle of the rotor (i.e., the rotation angle of the motor) provided in the resolver. Therefore, in the motor control device on the premise that the motor is controlled based on the two-phase pulse signal, there is a problem that the detection results by the angle detection device disclosed in Patent Document 1 or the like cannot be used as it is. Other objects and novel features will become apparent from the description of this specification and the accompanying drawings.

According to one embodiment, the pulse signal generator includes: a first compensation unit outputting a compensation signal for compensating for a deviation between the first angle information, which is data representing a rotation angle of the rotor provided in the resolver, and the fed-back second angle information; a counter pulse output unit outputting a counter pulse having a frequency corresponding to a compensation amount of the compensation signal together with sign information representing a positive or negative of the compensation signal; and a pulse processing unit having a counter performing either count-up or count-down of the counter pulse according to the sign information, and outputting a count value per fixed period by the counter as the second angle information, and the pulse processing unit is configured to generate a two-phase pulse signal representing a rotation angle of the rotor using a value of a part of bits of the counter.

According to another embodiment, the pulse signal generator includes: a first compensation unit outputting a compensation signal for compensating a deviation between first angle information, which is data representing a rotation angle of the rotor provided in the resolver, and the fed-back second angle information; a counter pulse output unit outputting a counter pulse having a frequency corresponding to a compensation amount of the compensation signal together with sign information representing the sign information of the compensation signal; a pulse processing unit outputting a count value per a fixed cycle by the counter as the second angle information, which performs either count-up or count-down of the counter pulse according to the sign information; and a two-phase pulse output unit outputting a two-phase pulse signal representing a rotation angle of the rotor, which has a frequency corresponding to a compensation amount of the compensation signal and a phase shift corresponding to the sign of the compensation signal.

According to the above-mentioned embodiment, it is possible to provide a pulse signal generator suitable for generating a two-phase pulse signal required as information of a rotation angle of a motor from a motor control device, for example, and an angle detection system including the pulse signal generator.

DETAILED DESCRIPTION

Figure 1:
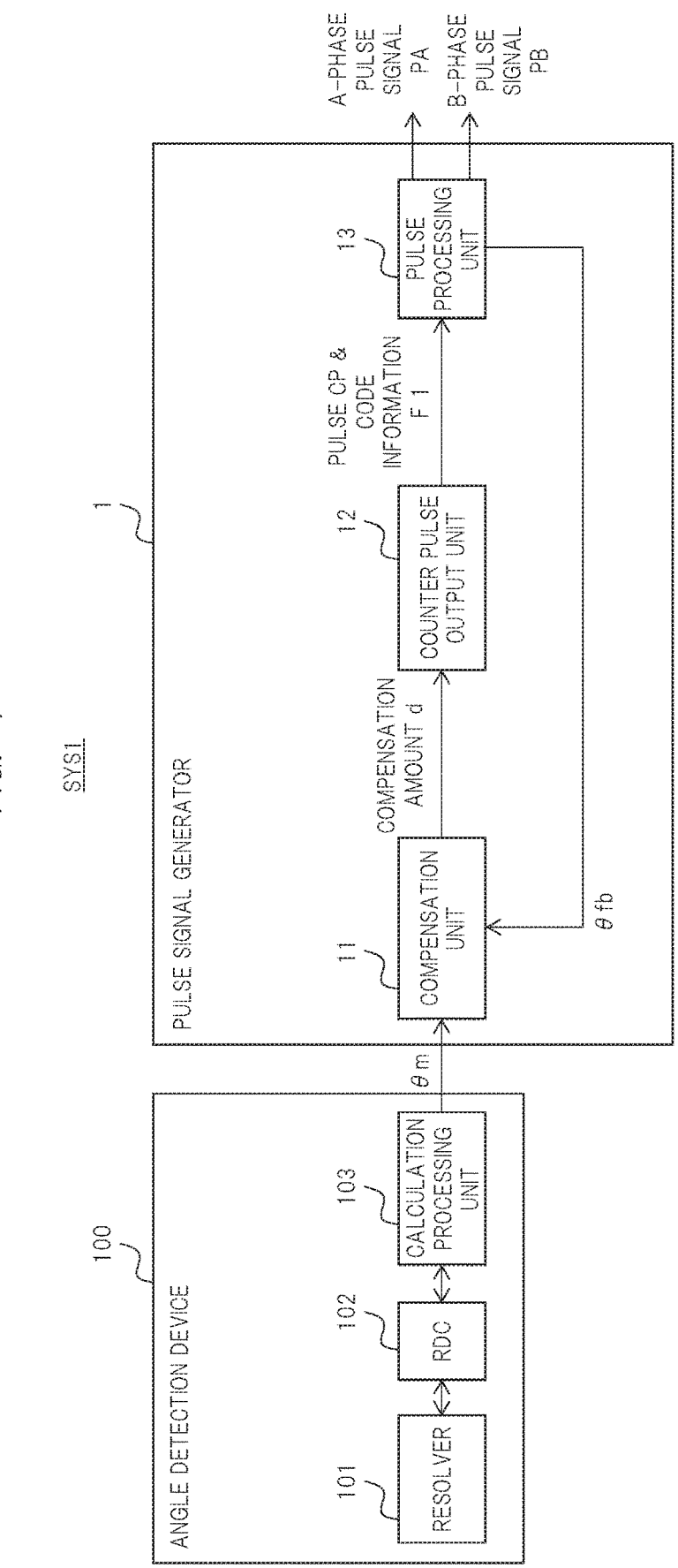
FIG. 1 is a block diagram illustrating a configuration example of an angle detection system including a pulse signal generator according to a first embodiment.

For clarity of explanation, the following description and drawings are appropriately omitted and simplified. In addition, the respective elements described in the drawings as functional blocks for performing various processes can be configured by a CPU (Central Processing Unit), a memory, and other circuits in terms of hardware, and are realized by programs loaded in the memory in terms of software. Therefore, it is understood by those skilled in the art that these functional blocks can be realized in various forms by hardware alone, software alone, or a combination thereof, and the present invention is not limited to any of them. In the drawings, the same elements are denoted by the same reference numerals, and a repetitive description thereof is omitted as necessary.

Also, the programs described above may be stored and provided to a computer using various types of non-transitory computer readable media. Non-transitory computer readable media includes various types of tangible storage media. Examples of non-transitory computer-readable media include magnetic recording media (e.g., flexible disks, magnetic tapes, hard disk drives), magneto-optical recording media (e.g., magneto-optical disks), CD-ROM (Read Only Memory, a CD-R, a CD-R/W, solid-state memories (e.g., masked ROM, PROM (Programmable ROM), EPROM (Erasable PROM, flash ROM, RAM (Random Access Memory)). The program may also be supplied to the computer by various types of transitory computer-readable media. Examples of transitory computer-readable media include electrical signals, optical signals, and electromagnetic waves. The transitory computer readable medium may provide the program to the computer via wired or wireless communication paths, such as electrical wires and optical fibers.

FIG. 1 is a block diagram illustrating a configuration example of an angle detection system SYS1 according to a first embodiment of the present invention. The angle detection system SYS1 is, for example, a system for detecting a rotational angle of a motor. Hereinafter, a concrete description will be given.

As shown in FIG. 1, the angle detection system SYS1 includes an angle detection device 100 and a pulse signal generator 1. The angle detection device 100 includes a resolver 101, a Resolver Digital Converter (RDC) 102, and a calculation processing unit 103. The calculation processing unit 103 is, for example, a microcomputer.

The resolver 101 is attached to the rotation shaft of the motor. The rotor provided in the resolver 101 rotates in accordance with the rotation of the motor. For example, excitation signals of a sine wave (=sin ωt) are inputted from the calculation processing unit 103 to the resolver 101 via an RDC 102. In response, the resolver 101 outputs two-phase detection signals R1 (=K·sin θm·sin ωt) and R2 (=K·cos θm·sin ωt) corresponding to the rotation angle of the rotor (i.e., the rotation angle of the motor) θm. Where K is a constant (e.g., amplifier gain), ω is the angular momentum of the excitation signal, and t is time.

The RDC 102 digitally converts the detected signals R1 and R2 output from the resolver 101 and outputs them to the calculation processing unit 103. As an example, the RDC 102 adds the signal R1'(=K·sin θm·cos ωt) having shifted the phase of the detection signal P1 by 90 degrees and the detection signal R2, and then converts the summation result (=K·sin(ωt+θm)) to the digital signal D1 for output in this case, the phase difference between the addition result and the excitation signal represents the rotation angle θm of the rotor.

The calculation processing unit 103 calculates information on the rotational angle of the rotor (first angle information) θm from the digital signal D1 outputted from the RDC 102. Here, the calculation processing unit 103 does not output two-phase pulse signals (so-called A-phase and B-phase pulse signals) as information on the rotation angle of the rotor, but outputs a count value (angle data) by a timer counter according to, for example, the phase difference between the addition result and the excitation signal. Therefore, in the motor control device on the assumption that, the motor is controlled based on the two-phase pulse signal, the angle data calculated by the calculation processing unit 103 cannot be used as it is.

Therefore, in the present embodiment, the pulse signal generator 1 converts the angle information θm output from the angle detection device 100 into two-phase pulse signals PA and PB.

Specifically, the pulse signal generator 1 includes a compensation unit 11, a counter pulse output unit 12, and a pulse processing unit 13.

The compensation unit 11 outputs a compensation signal d for compensating the deviation e between the angle information θm from the angle detection device 100 and the angle information θfb fed back from the pulse processing unit 13, which will be described later. Note that the compensation signal d includes sign information indicating the sign of the compensation and a compensation amount.

For example, the compensation unit 11 outputs the compensation signal d by performing PI (Proportional Integral) control on the deviation e between the angle information θm and the angle information θfb.

The counter pulse output unit 12 outputs a counter pulse CP having a frequency corresponding to the compensation amount of the compensation signal d, that is, a frequency proportional to the rotation frequency of the rotor, together with sign information F1 representing the sign of the compensation signal d.

The pulse processing unit 13 has an up/down counter that performs either count-up or count-down of the counter pulse CP in accordance with the code information F1, and outputs a count value per a predetermined period by the up/down counter as the angle information θfb.

The up/down counter provided in the pulse processing unit 13 performs the count-up operation of the counter pulse CP when the code information F1 indicates that the compensation signal d is positive, and performs the count-down operation of the counter pulse CP when the code information F1 indicates that the compensation signal d is negative. The count value of the up/down counter per predetermined period is fed back to the compensation unit 11 as the angle information θfb.

The pulse processing unit 13 generates the A-phase pulse signal PA and the B-phase pulse signal PB from the values of some bits of the count value of the up/down counter.

Figure 2:
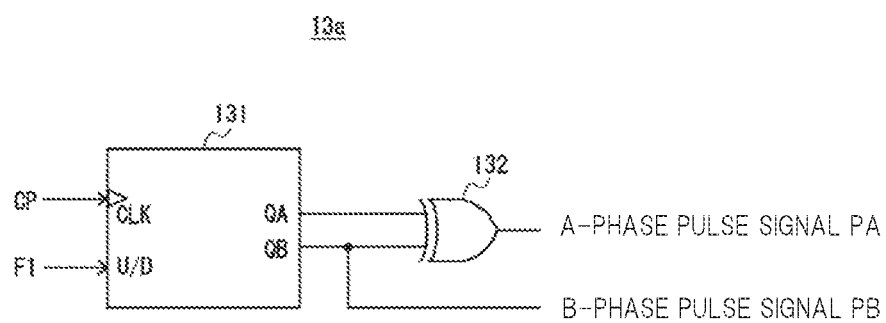
FIG. 2 is a diagram illustrating a specific configuration example of a pulse processing unit disposed in a pulse signal generator.

FIG. 2 is a diagram illustrating a specific configuration example of a portion of a pulse processing unit 13 in which two-phase pulse signals PA and PB are generated in the pulse processing unit 13 as a pulse processing unit 13a. As shown in FIG. 2, the pulse processing unit 13a includes at least an up/down counter 131 and an XOR circuit 132.

In the pulse processing unit 13a, the up/down counter 131 performs the count-up operation of the counter pulse CP when the code information F1 indicates that the compensation signal d is positive, and performs the count-down operation of the counter pulse CP when the code information F1 indicates that the compensation signal d is negative. Then, the pulse processing unit 13a outputs the A-phase pulse signal PA and the B-phase pulse signal PB using the value of the lower two bits of the count value of the up/down counter 131.

Specifically, in the pulse processing unit 13a, the XOR circuit 132 outputs the exclusive OR of the value QA of the least significant bit of the count value and the value QB of the second least significant bit as the A-phase pulse signal PA. The pulse processing unit 13a outputs the value QB of the second least significant bit as it is as the B-phase pulse signal PB. The A-phase pulse signal PA and the B-phase pulse signal PB have a frequency corresponding to the frequency of the counter pulse CP, that is, a frequency proportional to the rotation frequency of the rotor, and have a phase shift corresponding to the positive and negative of the compensation signal d.

Note that the pulse processing unit 13a can be appropriately changed to another configuration capable of realizing the same function as the above-described configuration. For example, the pulse processing unit 13a is not limited to the case where one up/down counter for generating the angle information θfb and the two-phase pulse signals PA and PB is provided, and can be appropriately changed to a configuration including an up/down counter for generating the angle information θfb and another up/down counter for generating the two-phase pulse signals PA and PB.

In the present embodiment, the case where the counter pulse output unit 12 outputs the counter pulse CP and the code information F1 is described as an example, but the present invention is not limited thereto. The counter pulse output, unit 12 may be configured to output the counter pulse CP when the compensation signal d is positive as the up counter pulse CP_U, and to output the counter pulse CP when the compensation signal d is negative as the down counter pulse CP_D. In this case, the configuration of the pulse processing unit 13 is also changed as follows.

Figure 3:
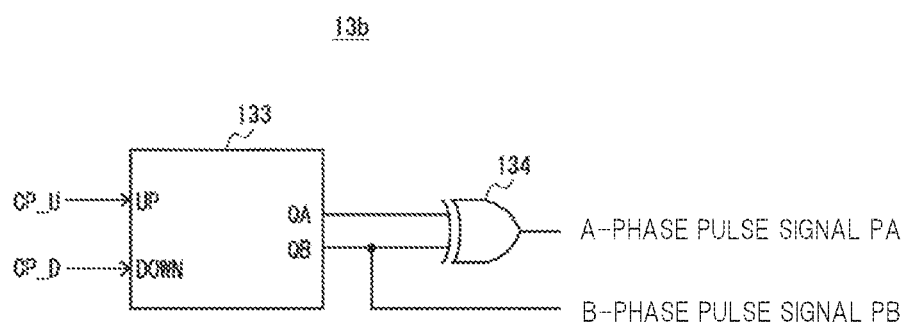
FIG. 3 is a diagram illustrating a modified example of the pulse processing unit shown in FIG. 2.

FIG. 3 is a diagram illustrating a modified example of the generation portion of the two-phase pulse signals PA and PB of the pulse processing unit 13 as a pulse processing unit 13b. As shown in FIG. 3, the pulse processing unit 13b includes at least an up/down counter 133 and an XOR circuit 134.

The up-down counter 133 performs a count-up operation of the pulse when the up-counter pulse CP_U is input, and performs a count-down operation of the pulse when the down-counter pulse CP_D is input. Then, the pulse processing unit 13b outputs the A-phase pulse signal PA and the B-phase pulse signal PB using the value of the lower two bits of the count value of the up/down counter 133.

Specifically, in the pulse processing unit 13b, the XOR circuit 134 outputs the exclusive OR of the value QA of the least significant bit of the count value and the value QB of the second least significant bit as the A-phase pulse signal PA. The pulse processing unit 13b outputs the value QB of the second bit from the lower order as it is as the B-phase pulse signal PB. The A-phase pulse signal PA and the B-phase pulse signal PB have a frequency corresponding to the frequency of the counter pulse CP, that is, a frequency proportional to the rotation frequency of the rotor, and have a phase shift corresponding to the positive and negative of the compensation signal d.

Figure 4:
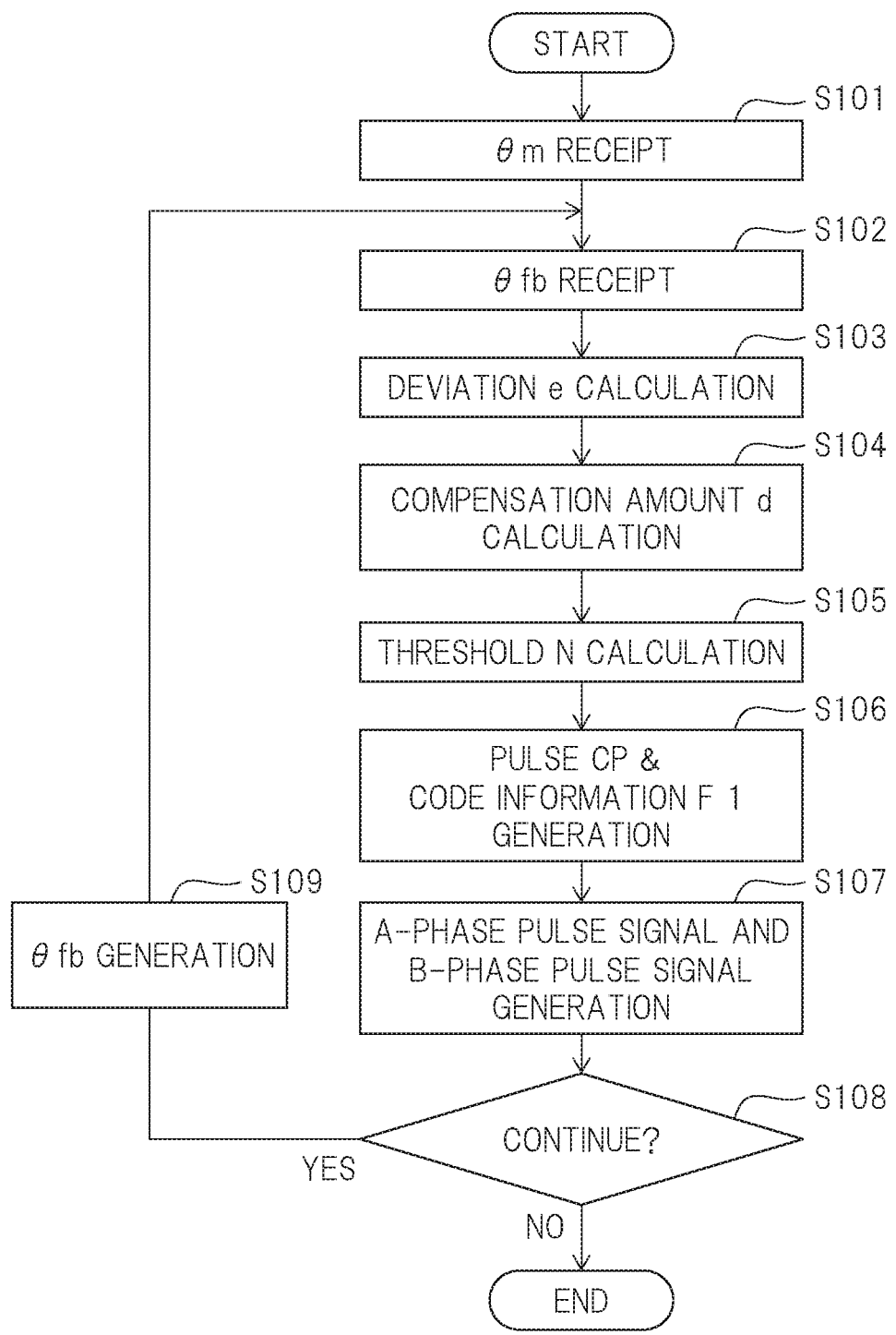
FIG. 4 is a flowchart illustrating the operation of a pulse signal generator.
Figure 5:
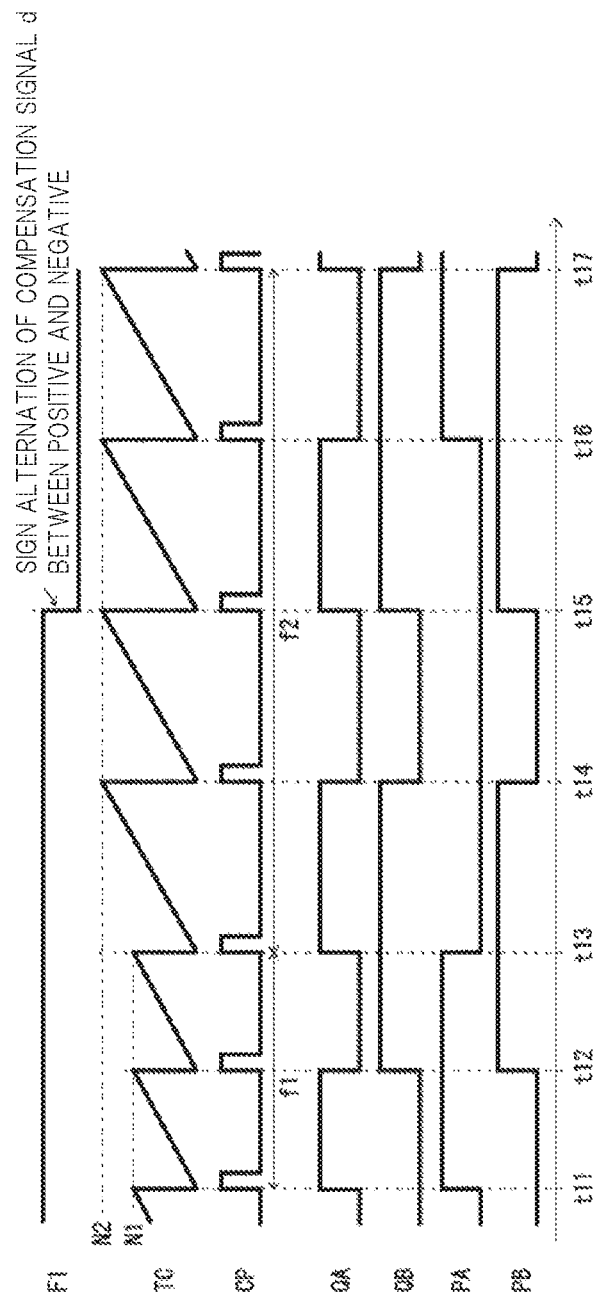
FIG. 5 is a timing chart illustrating the operation of the pulse signal generator shown in FIG. 1.

Next, the operation of the pulse signal generator 1 will be described with reference to FIGS. 4 and 5. FIG. 4 is a flowchart illustrating the operation of the pulse signal generator 1. FIG. 5 is a timing chart illustrating the operation of the pulse signal generator 1.

In the pulse signal generator 1, the compensation unit 11 receives the angle information θm as the angle data from the angle detection device 100 (step 3101 in FIG. 4), and receives the angle information θfb fed back from the pulse processor 13 (step S102 in FIG. 4).

The compensation unit 11 calculates a deviation e (=θm−θfb) between the angle information θm and the angle information θfb (step S103 in FIG. 4). Thereafter, the compensation unit 11 outputs the compensation signal d by performing PI control on the deviation e, for example, in step S104 of FIG. 4.

Thereafter, the counter pulse output unit 12 outputs the counter pulse CP having a frequency corresponding to the compensation amount of the compensation signal d (i.e., a frequency proportional to the rotational frequency of the rotor) together with the sign information F1 representing the sign information of the compensation signal d (steps S105 and S106 in FIG. 4).

The counter pulse CP is generated by using, for example, a timer built in the calculation processing unit 103. Specifically, the counter pulse output unit 12 generates the counter pulse CP when the count value TC by the timer reaches the threshold N, and resets the count value TC by the timer to zero (step S106 in FIG. 4). Here, the threshold value N is set to a value corresponding to the compensation amount of the compensation signal d (step S105 in FIG. 4).

Specifically, the frequency f of the counter pulse CP can be expressed as f=Ka·d, where Ka is a proportionality constant and d is a correction amount of the correction signal d. Therefore, when the frequency of the timer counter is fclk, the threshold value N can be expressed by the following equation (1).

$$N = fclk/(Ka \cdot d) \quad (1)$$

However, when d=0, that is, when the rotor is not rotating, the comparison matching operation is stopped by setting the maximum value of the timer counter to the threshold value N+1, for example.

As can be understood from the equation (1), the threshold value N becomes smaller as the compensation amount of the compensation signal d (i.e., the number of rotations of the rotor) becomes larger, and becomes larger as the compensation amount of the compensation signal d becomes smaller.

Here, if f max is the maximum frequency [Hz] of the counter pulse CP, and d max is the maximum compensation amount of the compensation signal d, the proportionality constant Ka can be expressed by the following equation (2).

$$Ka = f\,max/d\,max \quad (2)$$

Note that f max can be expressed by the following equation (3) when the angle resolution of the counter pulse CP is Rm[P/R] (the number of pulses generated per one rotation of the motor) and the maximum rotation speed of the motor CP is RPM max[r/min (the rotation speed per one minute of the motor CP).

$$F\,max = Rm \cdot (RPM\,max/60) \quad (3)$$

The d max can be expressed by the following equation (4) where in the minimum rotation speed of the motor is RPM Min[r/min and the maximum rotation speed of the motor is RPM max[r/min.

$$d\,max = RPM\,max/RPM\,min \quad (4)$$

For example, if the deviation e is zero, i.e., θm=θfb, the compensation amount d=0. In this case, since the motor is not rotating, the counter pulse CP is not generated. On the other hand, as the deviation e increases, the compensation amount d increases, so that the threshold value N decreases, and as a result, the frequency of the counter pulse CP increases. When the deviation e becomes the largest, since the compensation amount d indicates the maximum value d max, the threshold value N indicates the minimum value, and as a result, the frequency f of the counter pulse CP indicates the maximum value f max.

Thereafter, the pulse processing unit 13 counts up the count value of the up-down counter when the code information F1 indicates that the compensation signal d is positive, and counts down the count value of the up-down counter when the code information F1 indicates that the compensation signal d is negative. Then, the pulse processor 13 outputs the two-phase pulse signals PA and PB using the value of the lower two bits of the count value of the up/down counter (step S107 in FIG. 4).

In addition, the pulse processor 13 outputs the count value per predetermined period by the up/down counter as the angle information θfb (if YES in step S108 of FIG. 4 then step S109). When the operation is not continued, the pulse signal generator 1 stops operation (NO in step S108 of FIG. 4).

Referring to FIG. 5, first, when the threshold N is N1, the frequency f of the counter pulse CP becomes f1 from time t11 to t13. Thereafter, when the threshold value N changes from N1 to N2 (N2>N1) due to a decrease in the rotation frequency of the rotor, the frequency f of the counter pulse CP changes from f1 to f2 (f2<f1) from time t13 to t17.

As can be seen from FIG. 5, the two-phase pulse signals PA and PB have a frequency corresponding to the frequency f of the counter pulse CP, that is, a frequency proportional to the rotation frequency of the rotor. More specifically, the two-phase pulse signals PA and PB have a frequency of ¼ of the frequency f of the counter pulse CP. Therefore, the motor control device that has received the two-phase pulse signals PA and PB can determine the rotation speed of the motor based on the frequencies of the two-phase pulse signals PA and PB.

As can be seen from FIG. 5, when d>0, that is, when the code information F1 is at the H level (time t11 to t15), the logic value of the B-phase pulse signal PB changes with a delay of a predetermined phase (for example, 90 degrees) with respect to the logic value change of the A-phase pulse signal. PA. On the other hand, when d<0, that is, when the code information F1 is at the L level (time t15 to t17), the logic value of the A-phase pulse signal PA changes with a delay of a predetermined phase (for example, 90 degrees) with respect to the logic value change of the B-phase pulse signal PB. Therefore, the motor control device that has received the two-phase pulse signals PA and PB can determine the rotation direction of the motor based on the difference in phase shift between the two-phase pulse signals PA and PB.

As described above, the pulse signal generator 1 according to the present embodiment can convert the angle information θm, which is data representing the rotation angle of the rotor provided in the resolver, that is, the rotation angle of the motor, into the two-phase pulse signals PA and PB required from the motor control device at the subsequent stage, and output the converted signal.

Figure 6:
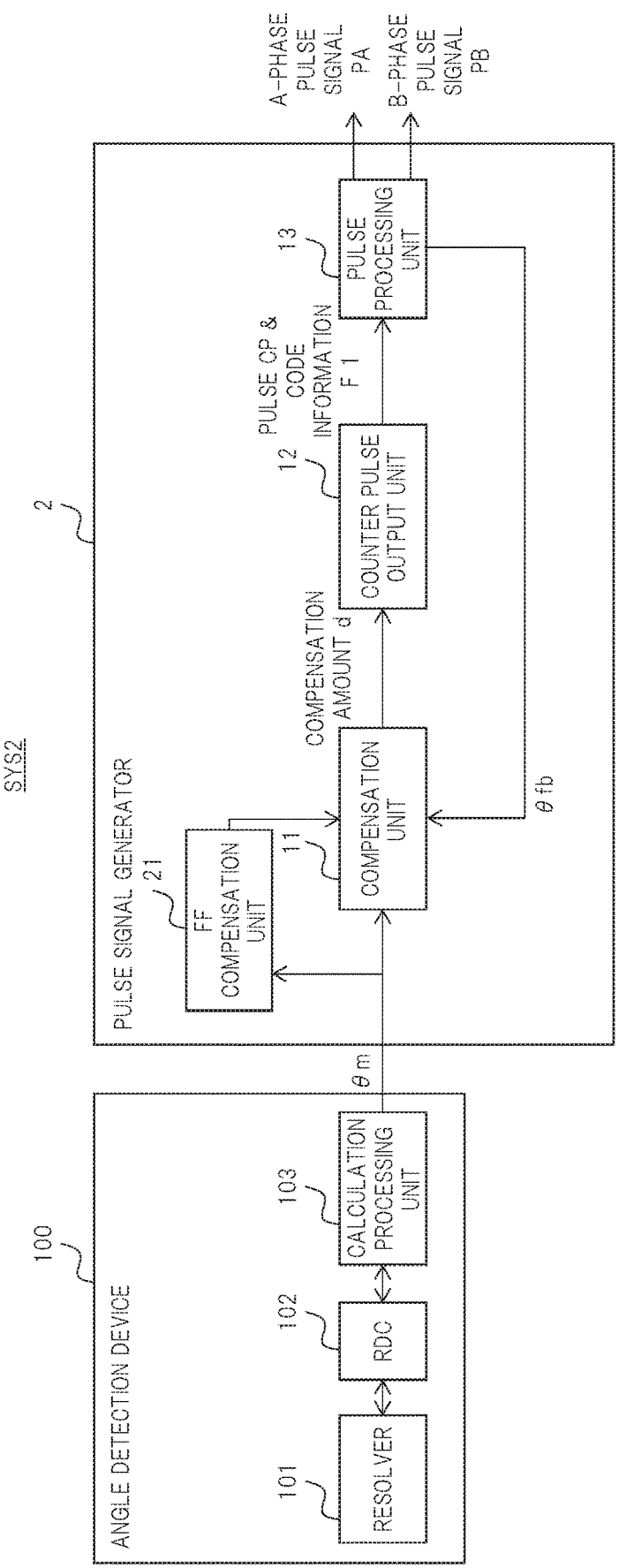
FIG. 6 is a block diagram illustrating a configuration example of an angle detection system with a pulse signal generator according the second embodiment.

FIG. 6 is a block diagram illustrating a configuration example of an angle detection system SYS2 according to the second embodiment. The angle detection system SYS2 includes an angle detection device 100 and a pulse signal generator 2. The pulse signal generator 2 further includes a feed forward compensation unit (FF compensation unit) 21 as compared with the pulse signal generator 1.

The FF compensation unit 21 performs feed-forward control on the angle information θm. Then, the compensation unit 11 outputs the compensation signal d by adding the result of performing the PI control on the deviation e between the angle information θm and the angle information θfb and the output of the FF compensation unit 21.

Figure 7:
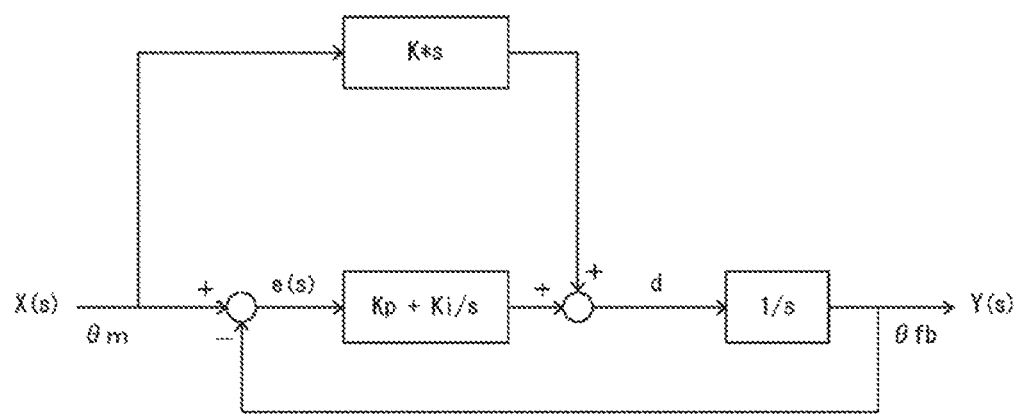
FIG. 7 is a diagram illustrating a transfer function of a pulse signal generator shown in FIG. 6.
Figure 8:
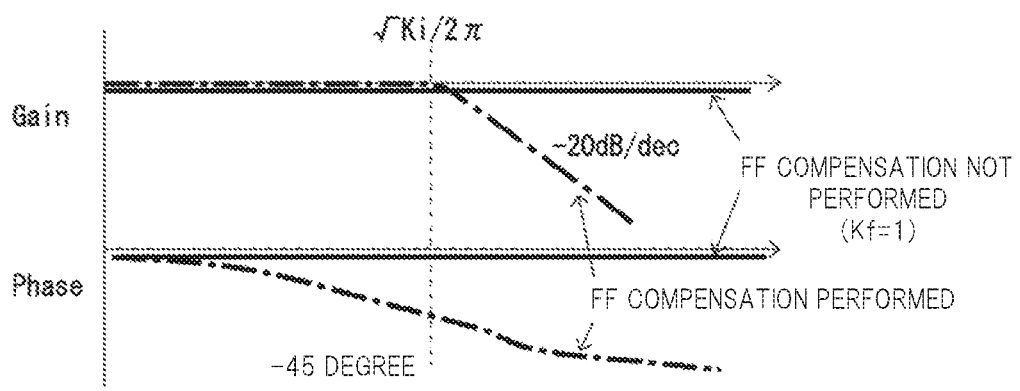
FIG. 8 is a diagram illustrating an effect of a pulse signal generator shown in FIG. 6.

FIG. 7 is a diagram illustrating a transfer function of the pulse signal generator 2. FIG. 8 is a diagram illustrating the effect of the pulse signal generator 2.

As shown in FIG. 7, when the input of the pulse signal generator 2 is X(s) and the output is Y(s), the transfer function G(s) is expressed as G(s)=Y(s)/X(s). Where s is a complex number. Here, Y(s) can be represented by the following equation (5). Where Kp is the proportional gain, Ki is the integral gain, and Kf is the gain of the feed-forward control.

[Equation 1]

$$Y(s)=1/s \cdot ((Kp+Ki/s)(X(s)-Y(s))+Kf \cdot s \cdot X(s)) \quad (5)$$

From the equation (5), the transfer function G(s) can be expressed as the following equation (6).

$$G(S)= \quad \text{[Equation 2]}$$

Here, when Kf=1, the transfer function G(s)=1. That is, Y(s)=X(s) holds. That is, theoretically, no delay or steady-state deviation occurs in the output. Y(s) with respect to the input X(s) (see FIG. 8).

Figure 9:
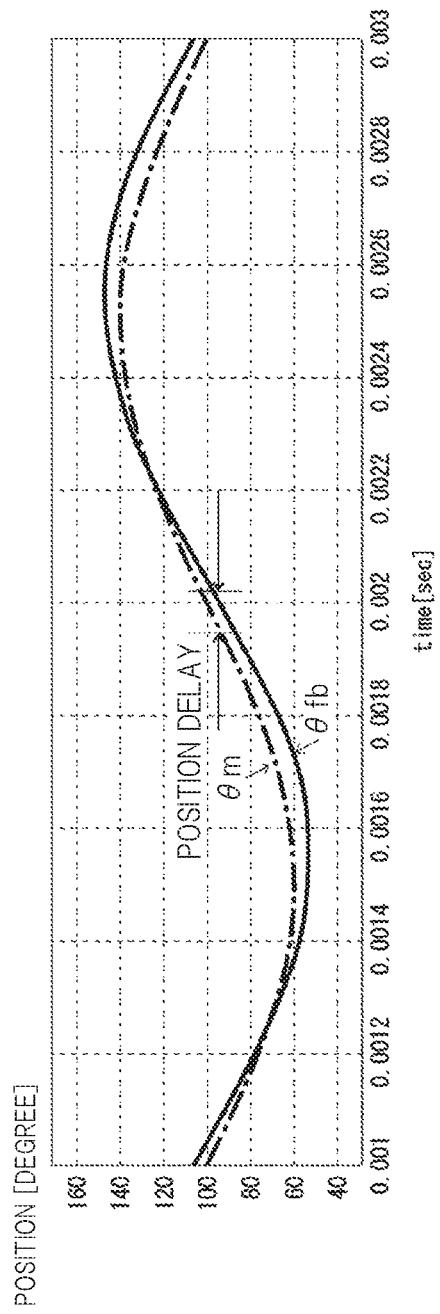
FIG. 9 is a diagram illustrating a relationship between angle information θm and angle information θfb when feed forward control is not performed by an FF compensation unit.
Figure 10:
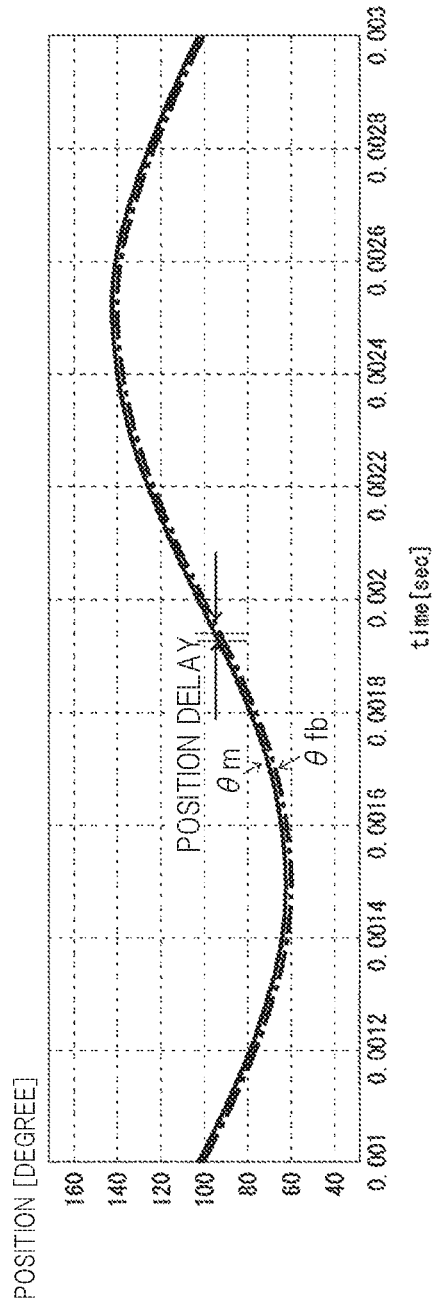
FIG. 10 is a diagram illustrating a relationship between angle information em and angle information θfb when feed forward control is performed by an FF compensation unit.

FIG. 9 is a diagram illustrating the relationship between the angle information θm and the angle information θfb when the feed forward control by the FF compensation unit 21 is not performed. FIG. 10 is a diagram illustrating the relationship between the angle information θm and the angle information θfb when the feed forward control is performed by the FF compensation unit 21.

As can be seen from a comparison of FIG. 9 and FIG. 10, when the feedforward control is not performed, a delay occurs in the output of the angle information θfb with respect to the input of the angle information θm. On the other hand, in the case of the feed-forward control, almost no delay occurs in the output of the angle information θfb with respect to the input of the angle information θm.

As described above, the pulse signal generator 2 according to the present embodiment performs not only PI control by the compensation unit 11 with respect to the deviation e between the angle information θm and the angle information θfb, but also feedforward control by the FF compensation unit 21 with respect to the angle information θm. As a result, the pulse signal generator 2 according to the present embodiment can cancel the influence of the frequency characteristic caused by the tracking loop, and thus can quickly convert the information on the rotation angle of the rotor into the two-phase pulse signals PA and PB and output the two-phase pulse signals PA and PB.

Figure 11:
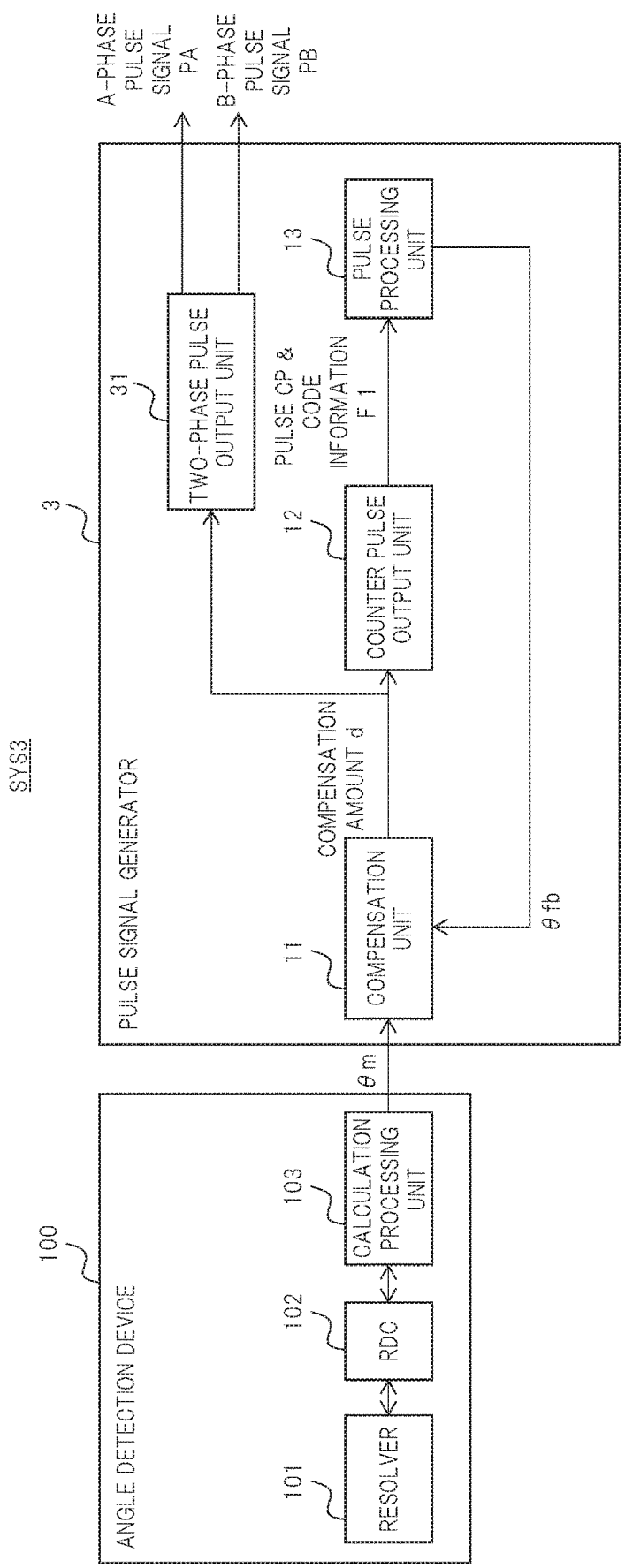
FIG. 11 is a block diagram illustrating a configuration example of an angle detection system with a pulse signal generator according to the third embodiment.

FIG. 11 is a block diagram illustrating a configuration example of an angle detection system SYS3 according to the third embodiment. The angle detection system SYS3 includes an angle detection device 100 and a pulse signal generator 3. The pulse signal generator 3 further includes a two-phase pulse output unit 31 as compared with the pulse signal generator 1.

In the pulse signal generator 1, the pulse processing unit 13 outputs the two-phase pulse signals PA and PB using the value of the lower two bits of the count value of the up/down counter. On the other hand, in the pulse signal generator 3, the two-phase pulse output unit 31 outputs two-phase pulse signals PA and PB having a frequency corresponding to compensation amount of the compensation signal d and a phase shift corresponding to the positive and negative of the compensation signal d.

Figure 12:
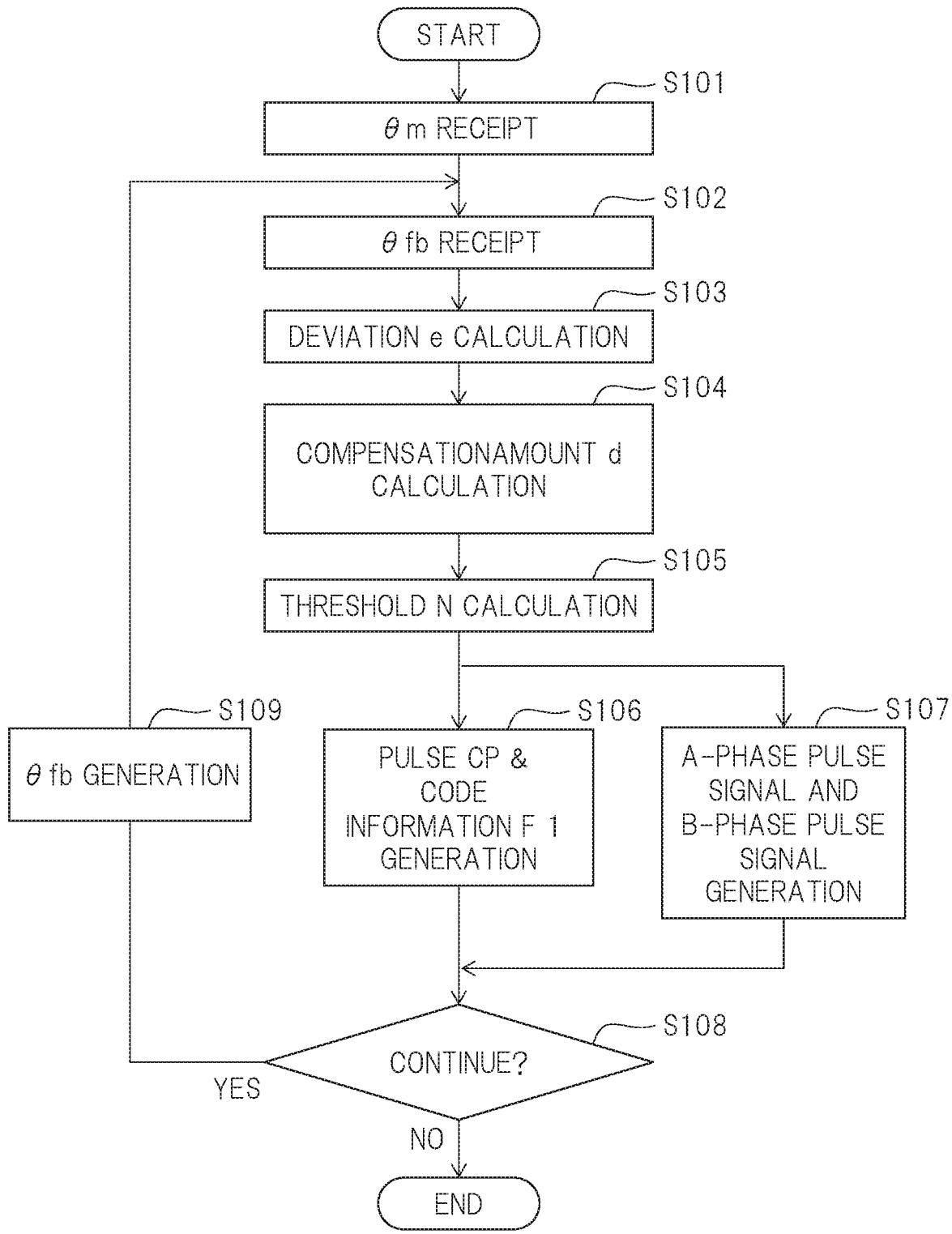
FIG. 12 is a flowchart illustrating operation of a pulse signal generator shown in FIG. 11.
Figure 13:
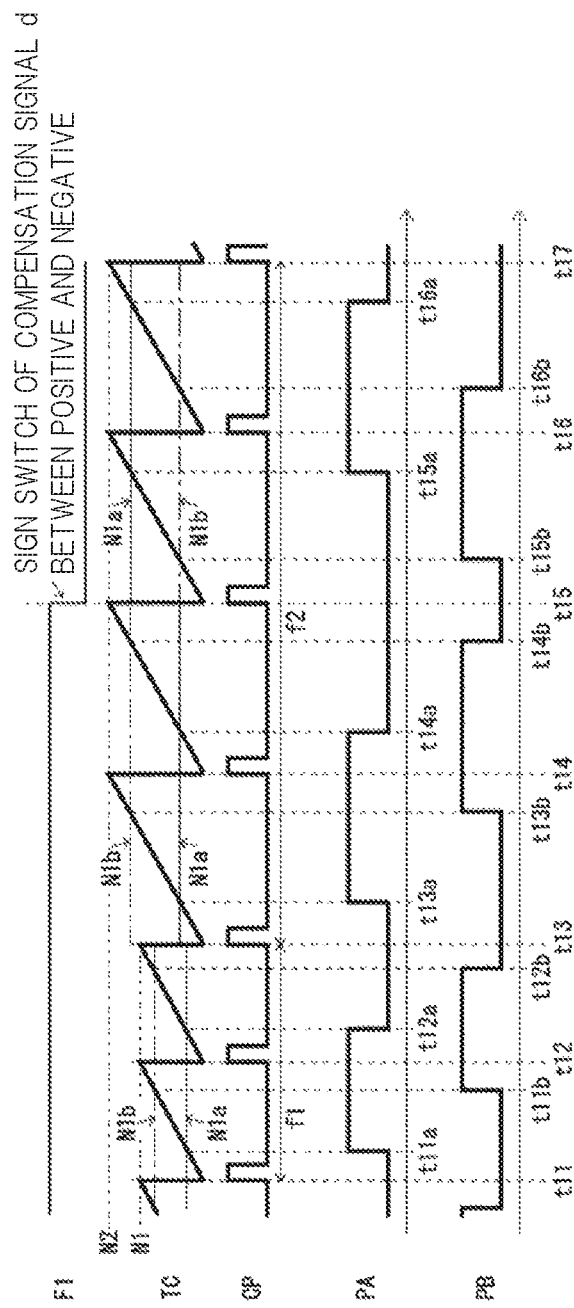
FIG. 13 is a timing chart illustrating the operation of the pulse signal generator shown in FIG. 11.

Next, the operation of the pulse signal generator 3 will be described with reference to FIGS. 12 and 13. FIG. 12 is a flowchart illustrating the operation of the pulse signal generator 3. FIG. 13 is a timing chart illustrating the operation of the pulse signal generator 3.

In the pulse signal generator 3, the compensation unit 11 receives the angle information θm as the angle data from the angle detection device 100 (step S101 in FIG. 12), and receives the angle information θfb fed back from the pulse processor 13 (step S102 in FIG. 12).

The compensation unit 11 calculates a deviation e (=θm−θfb) between the angle information θm and the angle information θfb (step S103 in FIG. 12). Thereafter, the compensation unit 11 outputs the compensation signal d by performing PI control on the deviation e, for example, in step S104 of FIG. 12.

Thereafter, the counter pulse output unit 12 outputs the counter pulse CP having frequency corresponding to the compensation amount of the compensation signal d (i.e., a frequency proportional to the rotational frequency of the rotor) together with the sign information F1 representing the sign information of the compensation signal d (steps S105 and S106 in FIG. 12).

The counter pulse CP is generated by using, for example, a timer built in the calculation processing unit 103. Specifically, the counter pulse output unit 12 generates the counter pulse CP when the count value TC ray the timer reaches the threshold N, and resets the count value TC by the timer to zero (step S106 in FIG. 12). Here, the threshold value N is set to a value corresponding to the compensation amount of the compensation signal d (step S105 in FIG. 12).

The two-phase pulse output unit 31 outputs two-phase pulse signals PA and PB having a frequency corresponding to the compensation amount of the compensation signal d (i.e., a frequency proportional to the rotational frequency of the rotor) and a phase shift corresponding to the positive and negative of the compensation signal d (step S107 in FIG. 12).

The A-phase pulse signal PA and the B-phase pulse signal PB are generated by using a timer built in the calculation processing unit 103, similarly to the case of the counter pulse CP. Specifically, the two-phase pulse output unit 31 changes the voltage level (logical value) of the A-phase pulse signal PA at the timing when the count value TC by the timer reaches the threshold value Na, and changes the voltage level (logical value) in of the B-phase pulse signal PB at the timing when the count value TC by the timer reaches the threshold value Nb.

Here, the thresholds Na and Nb are expressed by the following equation (7).

When $d>0$, $Na=(\frac{1}{4})\cdot N$ and $Nb=(\frac{3}{4})\cdot N$

When $d<0$, $Na=(\frac{3}{4})\cdot N$ and $Nb=(\frac{1}{4})\cdot N$ \hfill (7)

However, when d=0, that is, when the rotor is not rotating, the comparison matching operation is stopped by setting the maximum value of the timer counter+1' to the thresholds Na and Nb, for example.

The count value used for comparison with the thresholds Na and Nb at the time of generation of the A-phase pulse signal PA and the B-phase pulse signal PB is reset in synchronization with the reset of the count value used for comparison with the threshold N at the time of generation of the counter pulse CP. That is, each time the counter pulse CP is generated, the A-phase pulse signal PA and the B-phase pulse signal PB change the voltage level (logical value) with reference to the generation timing of the counter pulse.

Thereafter, the pulse processor 13 outputs the count value per predetermined period by the up/down counter as the angle information θfb (if YES in step S108 of FIG. 12 then step S109). The pulse signal generator 1 stops operation when the operation does not continue (if NO in step S108 of FIG. 12).

Referring to FIG. 13, first, when the threshold N is N1, the frequency f of the counter pulse CP becomes f1 at times from t11 to t13. Thereafter, when the threshold value N changes from N1 to N2 (N2>N1) due to a decrease in the rotation frequency of the rotor, the frequency f of the counter pulse CP changes from f1 to f2 (f2<f1) from t13 to t17.

Also, in the case where d>0, that is, the code information F1 is at the H level (from time t11 to t15), the voltage level (logical value) of the A-phase pulse signal PA is changed each time the counting value TC by the timer is reset at the generation timing of the counter pulse CP and reaches the threshold value Na of one-fourth of the threshold value N (at time t11a, t12a, t13a, t14a). The voltage level (logical value) of the B-phase pulse signal PB changes every time the voltage level (logical value) of the B-phase pulse signal PB reaches the threshold value Nb of three-quarters of the threshold value N after the count value TC by the timer is reset at the generation timing of the counter pulse CP (at time t11b, t12b, t13b, t14b).

On the other hand, in the case where d<0, that is, the code information F1 is at the L level (from time t15 to t17), the voltage level (logical value) of the B-phase pulse signal PB is changed each time the counting value TC by the timer is reset at the generation timing of the counter pulse CP and reaches the threshold value Nb of one-fourth of the threshold value N (at time t15b, t16b). The voltage level (logical value) of the A-phase pulse signal PA changes each time the voltage level (logical value) of the A-phase pulse signal PA reaches the threshold value Na of three-quarters of the threshold value N after the count value TC by the timer is reset at the generation timing of the counter pulse CP (from time t15a, t16a).

As can be seen from FIG. 13, the two-phase pulse signals PA and PB have a frequency corresponding to the frequency f of the counter pulse CP, that, is, a frequency proportional to the rotation frequency of the rotor. More specifically, the two-phase pulse signals PA and PB have a frequency of ½ of the frequency f of the counter pulse CP. Therefore, the motor control device that has received the two-phase pulse signals PA and PB can determine the rotation speed of the motor based on the frequencies of the two-phase pulse signals PA and PB.

As can be seen from FIG. 13, when d>0 (from time t11 to t15), the logic value of the B-phase pulse signal PB changes with a delay of a predetermined phase (for example, 90 degrees) with respect to the logic value change of the A-phase pulse signal PA. On the other hand, d<0 (from time t15 to t17), the logic value of the A-phase pulse signal PA changes with a delay of a predetermined phase (for example, 90 degrees) with respect to the logic value change of the B-phase pulse signal PB. Therefore, the motor control device that has received the two-phase pulse signals PA and PB can determine the rotation direction of the motor based on the difference in phase shift between the two-phase pulse signals PA and PB.

As described above, the pulse signal generator 3 according to the present embodiment can achieve the same effect as the pulse signal generator 1, and can improve the resolution of the two-phase pulse signals PA and PB twice as compared with the case of the pulse signal generator 1.

In the present embodiment, the counter pulse CP, the A-phase pulse signal PA, and the B-phase pulse signal PB are generated using the count value by the common timer. If the count value is reset in synchronization with the reset of the count value of the timer used to generate the counter pulse CP, the timer used to generate the A-phase pulse signal PA and the B-phase pulse signal PB may be different from the timer used to generate the counter pulse CP.

Figure 14:
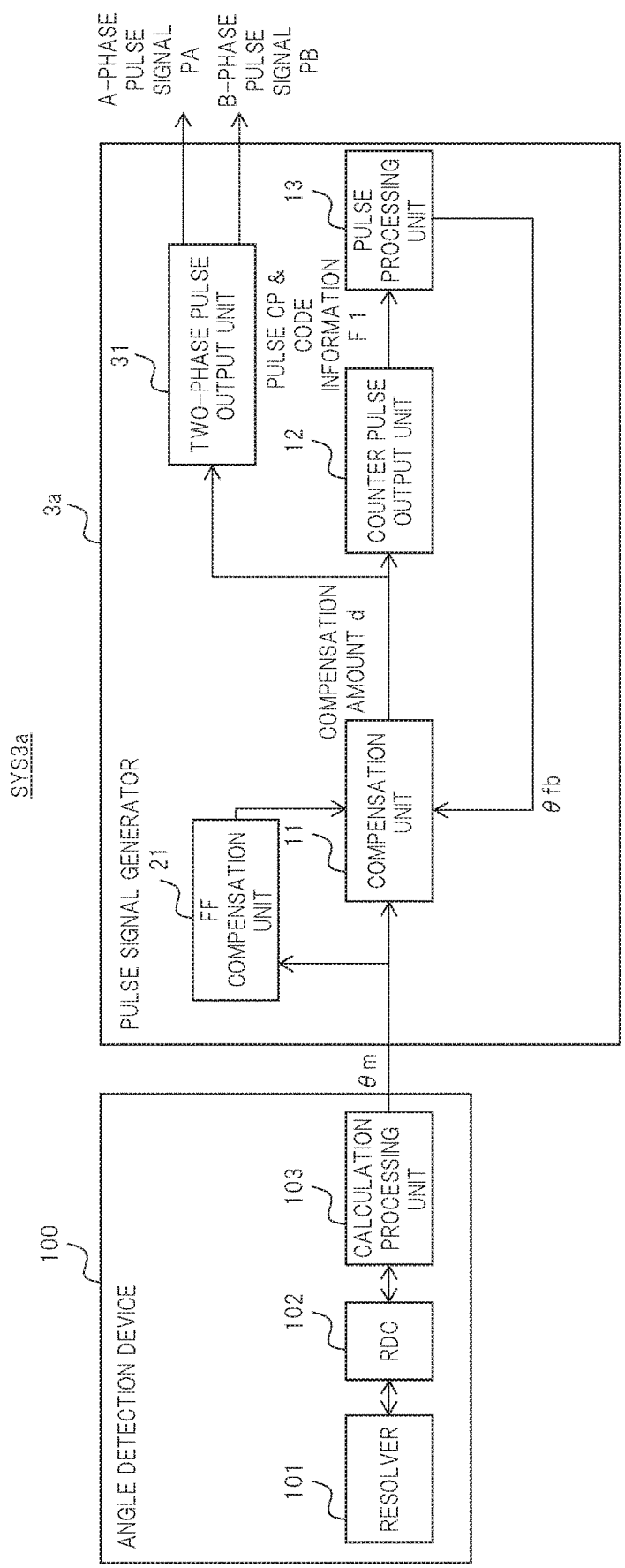
FIG. 14 is a block diagram illustrating a modification of a pulse signal generator shown in FIG. 11.

FIG. 14 is a diagram illustrating a modification of the angle detection system SYS3 as an angle detection system SYS3a. As shown in FIG. 14, the angle detection system SYS3a includes an angle detection device 100 and a pulse signal generator 3a. The pulse signal generator 3a further includes an FF compensation unit 21 as compared with the pulse signal generator 3. The FF compensation unit 21 is as described above.

The pulse signal generator 3a can produce the same effect as the pulse signal generator 3, and can quickly convert the information on the rotation angle of the rotor into the two-phase pulse signals PA and PB in the same manner as in the case of the pulse signal generator 2, and output the two-phase pulse signals PA and PB.

As described above, the pulse signal generator according to Embodiments 1 to 3 can convert the angle information θm, which is data representing the rotation angle of the rotor (i.e., the rotation angle of the motor) provided in the resolver, into the two-phase pulse signals PA and PB required by the motor control device at the subsequent stage, and output the converted signals.

The processing realized by all or part of the constituent elements of the pulse signal generator according to the first to third embodiments can be realized by a general-purpose computer system such as the calculation processing unit 103. Hereinafter, a brief description will be given with reference to FIG. 15.

Figure 15:
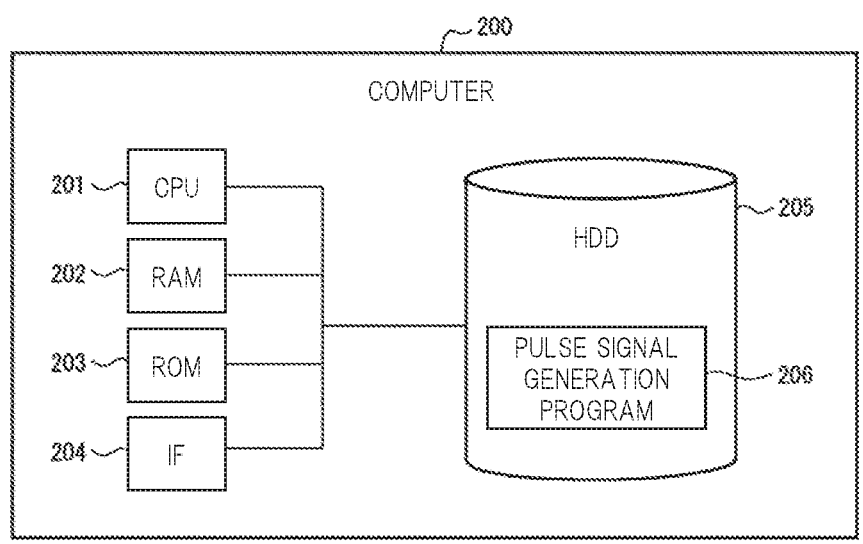
FIG. 15 is a block diagram illustrating an example of the hardware configuration of a pulse signal generator shown in FIG. 1.

FIG. 15 is a block diagram illustrating an example of the hardware configuration of the pulse signal generator 1. The computer 200 includes, for example, a CPU (Central Processing Unit) 201 which is a control device, a RAM (Random Access Memory) 202, a ROM (Read Only Memory) 203, an IF (Interface) 204 which is an interface with the outside, and an HDD (Hard Disk Drive) 205 which is an example of a nonvolatile storage device. In addition, the computer 200 may include an input device such as a keyboard and a mouse, and a display device such as a display, as a configuration not shown.

The HDD205 stores an operating system (Operating System) (not shown) and a pulse signal generation program 206. The pulse signal generation program 206 is a computer program on which the pulse signal generation processing according to the first embodiment is implemented.

The CPU 201 controls various processing, a RAM202, a ROM203, accesses to an IF 204, an HDD 205, and the like in the computer 200. The computer 200 reads and executes an OS and pulse signal generation program 206 in which the CPU 201 is stored in an HDD 205. Thus, the computer 200 realizes the pulse signal generator 1 according to the first embodiment.

Here, a case where the pulse signal generator 1 is realized by a general-purpose computer system has been described, but the present invention is not limited thereto. The case of the pulse signal generator 2, 3, 3a can likewise be realized by means of a general-purpose computer system.

Although the invention made by the inventor has been specifically described based on the embodiment, the present invention is not limited to the embodiment already described, and it is needless to say that various modifications can be made without departing from the gist thereof.

Some or all of the above-described embodiments may be described as the following appendix, but the present invention is not limited to the following.

(Appendix 1)

A method for generating a two-phase pulse signal representing a rotation angle of a motor comprises
generating compensation signal compensating for a deviation between first angle information which is data representing a rotation angle of a rotor provided in a resolver, and fed back second angle information;
generating a counter pulse having a frequency corresponding to a compensation amount of the compensation signal together with sign information representing a sign of the compensation signal;
generating a count value per a fixed period by a counter which performs either count-up or count-down of the counter pulse according to the sign information as the second angle information, and
generating the two-phase pulse signal representing a rotation angle of the rotor using a value of a part of bits of the counter.

(Appendix 2)

A method for generating a two-phase pulse signal representing a rotation angle of a motor comprises:
generating a compensation signal compensating for a deviation between first angle information, which is data representing a rotation angle of a rotor provided in a resolver, and the fed back second angle information;
generating a counter pulse having a frequency corresponding to a compensation amount of the compensation signal together with sign information representing a sign of the compensation signal;
generating a count value per a fixed period by a counter which performs either count-up or count-down of the counter pulse according to the sign information as the second angle information, and
generating a two-phase pulse signal representing a rotation angle of the rotor having a frequency corresponding to a compensation amount of the compensation signal and a phase shift corresponding to a positive or negative phase of the compensation signal.

What is claimed is:

1. A pulse signal generator that generates a two-phase pulse signal for a motor, the pulse signal generator comprising:
a first compensation unit configured to output a compensation signal compensating for a deviation between first angle information and second angle information, the first angle information being data representing a rotation angle of a rotor provided in a resolver, the rotor rotating in accordance with a rotation of the motor;
a counter pulse output unit configured to output a counter pulse having a frequency associated with a compensation amount of the compensation signal and sign information representing a sign of the compensation signal, and
a pulse processing unit including a counter configured to perform either count-up or count-down of the counter pulse according to the sign information, and to generate a count value per fixed period by the counter as the second angle information, and generate the two-phase pulse signal based on the second angle information.

2. The pulse signal generator according to claim 1, wherein the pulse processing unit generates the two-phase pulse signal using a value of a part of bits of the counter.

3. The pulse signal generator according to claim 2, wherein the first compensation unit is further configured to output the compensation signal by performing Proportional Integral control on the deviations.

4. The pulse signal generator according to claim 2, further comprising a second compensation unit configured to perform Feed-Forward control on the first angle information, wherein the first compensation unit outputs the compensation signal based on a result of performing Proportional Integral control on the deviations, and an output of the second compensation unit.

5. The pulse signal generator according to claim 2, wherein the pulse processing unit is configured to generate the two-phase pulse signal using the value of the lower two bits of the counter.

6. The pulse signal generator according to claim 2,
wherein the counter pulse output unit is configured to output the counter pulse as an up counter pulse when the compensation signal is positive and output the counter pulse as a down counter pulse when the compensation signal is negative, and
wherein the counter is further configured to count up the up counter pulse and count down the down counter pulse.

7. The pulse signal generator according to claim 2, wherein a frequency of the counter pulse is proportional to a rotational frequency of the rotor.

8. An angle detection system comprising the pulse signal generator according to claim 2, further comprising an angle detection device including the resolver and detecting the rotation angle of the rotor provided in the resolver, wherein the angle detection device outputs the first angle information.

9. A pulse signal generator that generates a two-phase pulse signal for a motor, the pulse signal generator comprising:
a first compensation unit configured to output a compensation signal compensating for a deviation between first angle information and second angle information, the first angle information being data representing a rotation angle of a rotor provided in a resolver, the rotor rotating in accordance with a rotation of the motor;
a counter pulse output unit configured to output a counter pulse having a frequency associated with a compensation amount of the compensation signal and sign information representing a sign of the compensation signal;
a pulse processing unit including a counter configured to perform either count-up or count-down of the counter pulse according to the sign information, and to output a count value per fixed period by the counter as the second angle information, and
a two-phase pulse output unit configured to output the two-phase pulse signal having the frequency associated with the compensation amount of the compensation signal and a phase shift associated with the sign of the compensation signal.

10. The pulsed signal generator according to claim 9, wherein the first compensation unit is configured to output the compensation signal by performing Proportional Integral control on the deviations.

11. The pulse signal generator according to claim 9, further comprising a second compensation unit for performing Feed-Forward control on the first angular information, wherein the first compensation unit outputs the compensation signal based on a result of performing Proportional Integral control on the deviations, and an output of the second compensation unit.

12. The pulse signal generator according to claim 9, wherein the two-phase pulse output unit is configured to change voltage level of the respective two-phase pulse signals with reference to the timing of generation of the counter pulse each time the counter pulse is generated.

13. The pulse signal generator according to claim 9,
wherein the counter pulse output unit is configured to output the counter pulse as an up counter pulse when the compensation signal is positive and output the counter pulse as a down counter pulse when the compensation signal is negative, and
wherein the counter is configured to count up the up counter pulse and count down the down counter pulse.

14. The pulse signal generator according to claim 9, wherein a frequency of the counter pulse is proportional to a rotation frequency of the rotor.

15. An angle detection system comprising the pulse signal generator according to claim 9, further comprising an angle detection device having the resolver and detecting a rotation angle of a rotor provided in the resolver, wherein the angle detection device outputs the first angle information.

* * * * *